(12) United States Patent
Lu et al.

(10) Patent No.: US 10,707,647 B2
(45) Date of Patent: Jul. 7, 2020

(54) STABLE LINEWIDTH NARROWING OF A COHERENT COMB LASER

(71) Applicant: National Research Council of Canada, Ottawa (CA)

(72) Inventors: Zhenguo Lu, Ottawa (CA); Jiaren Liu, Ottawa (CA); Philip Poole, Ottawa (CA); Chunying Song, Ottawa (CA); Shoude Chang, Ottawa (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 16/050,137

(22) Filed: Jul. 31, 2018

(65) Prior Publication Data

US 2019/0036304 A1 Jan. 31, 2019

Related U.S. Application Data

(60) Provisional application No. 62/539,113, filed on Jul. 31, 2017.

(51) Int. Cl.
*H01S 5/065* (2006.01)
*H01S 5/068* (2006.01)
(Continued)

(52) U.S. Cl.
CPC .......... *H01S 5/0657* (2013.01); *H01S 5/0687* (2013.01); *H01S 5/06817* (2013.01);
(Continued)

(58) Field of Classification Search
CPC .. H01S 5/0657; H01S 5/06817; H01S 5/0687; H01S 5/147; H01S 5/142;
(Continued)

(56) References Cited

U.S. PATENT DOCUMENTS

| 7,769,062 B2 | 8/2010 | Lu et al. |
| 7,991,023 B2 | 8/2011 | Liu et al. |

(Continued)

OTHER PUBLICATIONS

V. Ataie, E. Temprana, L. Liu, E. Myslivets, B. P.-P. Kuo, N. Alic, and S. Radic, "Flex-grid compatible ultrawide frequency comb source for 31.8 Tb/s coherent transmission of 1520 UDWDM channels," In the Proceedings of the Optical Fiber Communication Conference 2014, Postdeadline Paper, Th5B.7.

(Continued)

*Primary Examiner* — Armando Rodriguez
(74) *Attorney, Agent, or Firm* — Kenneth Murphy

(57) ABSTRACT

A technique for narrowing a linewidth of a plurality of lines of a coherent comb laser (CCL) concurrently comprises providing a mode-locked semiconductor coherent comb laser (CCL) adapted to output of at least 4 mode-locked lines; tapping a fraction of a power from the CCL from the laser cavity to form a tapped beam; propagating the tapped beam to an attenuator to produce an attenuated beam; and reinserting the attenuated beam into the laser cavity, where the reinserted beam has a power less than 10% of a power of the tapped beam. The reinsertion allows the CCL to be operated to output the mode-locked lines, each with a linewidth of less than 80% of the original linewidth. By propagating the tapped and attenuated beams on a solid waveguide, and ensuring that the secondary cavity is polarization maintaining, improved stability of the linewidth narrowing is ensured.

20 Claims, 4 Drawing Sheets

(51) Int. Cl.
| | |
|---|---|
| H01S 5/34 | (2006.01) |
| H01S 5/0687 | (2006.01) |
| H01S 5/14 | (2006.01) |
| H01S 5/10 | (2006.01) |
| H01S 5/00 | (2006.01) |
| H01S 5/22 | (2006.01) |

(52) U.S. Cl.
CPC .............. *H01S 5/142* (2013.01); *H01S 5/146* (2013.01); *H01S 5/3412* (2013.01); *H01S 5/0014* (2013.01); *H01S 5/06821* (2013.01); *H01S 5/1092* (2013.01); *H01S 5/22* (2013.01); *H01S 2301/02* (2013.01)

(58) Field of Classification Search
CPC ...... H01S 5/146; H01S 5/3412; H01S 5/0014; H01S 5/0621; H01S 5/06821; H01S 5/1092; H01S 5/22; H01S 2301/02
See application file for complete search history.

(56) References Cited

U.S. PATENT DOCUMENTS

| | | |
|---|---|---|
| 8,804,787 B1 | 8/2014 | Coleman et al. |
| 2014/0233593 A1* | 8/2014 | Qureshi .................. H01S 3/083 372/20 |
| 2019/0036305 A1* | 1/2019 | Lu ........................... H01S 5/142 |

OTHER PUBLICATIONS

Joerg Pfeifle, Victor Brasch, Matthias Lauermann, Yimin Yu, Daniel Wegner, Tobias Herr, Klaus Hartinger, Philipp Schindler, Jingshi Li, David Hillerkuss, Rene Schmogrow, Claudius Weimann, Ronald Holzwarth, Wolfgang Freude, Juerg Leuthold, Tobias J. Kippenberg and Christian Koos, "Coherent terabit communications with microresonator Kerr frequency combs," Nature Photonics, vol. 8, 375-380 (2014).
C. Weimann, P. C. Schindler, R. Palmer, S. Wolf, D. Bekele, D. Korn, J. Pfeifle, S. Koeber, R. Schmogrow, L. Alloatti, D. Elder, H. Yu, W. Bogaerts, L. R. Dalton, W. Freude, J. Leuthold, and C. Koos, "Silicon-organic hybrid (SOH) frequency comb sources for terabit/s data transmission," Optics Express, vol. 22, 3629-3637 (2014).
Z.G. Lu, F.G. Sun, G.Z. Xiao, P. Lin, and P. Zhao, "High-power multiwavelength Er3+—Yb3+ codoped double-cladding fiber ring laser," IEEE Photon., Technol. Lett., vol. 17, (9), pp. 1821-1823, 2005.
Z.G. Lu, and C.P. Grover, "A widely tunable narrow-linewidth triple-wavelength erbium-doped fiber ring laser," IEEE Photon. Technol. Lett., vol. 17, (1), pp. 22-24, 2005.
B. J. Puttnam, R. S. Luís, W. Klaus, J. Sakaguchi, J.-M. Delgado Mendinueta, Y. Awaji, N. Wada, Yoshiaki Tamura, Tetsuya Hayashi, Masaaki Hirano and J. Marciante, "2.15 Pb/s Transmission Using a 22 Core Homogeneous Single-Mode Multi-Core Fiber and Wideband Optical Comb," In the Proceedings of the 2015 European Conference on Optical Communication (ECOC 2015), Postdeadline Paper 3.1.
J. Pfeifle, A. Kordts, P. Marin, M. Karpov, M. Pfeiffer, V. Brasch, R. Osenberger, J. Kemal, S. Wolf, W. Freude, T.J. Kippenberg, and C. Koos, "Full C and L-Band Transmission at 20 Tbit/s Using Cavity-Soliton Kerr Frequency Combs," In the Proceedings of the 2015 Conference on Lasers and Electro-Optics (CLEO 2015), Postdeadline Paper: jTh5C.8.
J.R. Liu, Z.G. Lu, S. Raymond, P.J. Poole, P.J. Barrios, G. Pakulski, D. Poitras, G.Z. Xiao, and Z.Y. Zhang, "Uniform 90-channel multiwavelength InAs/InGaAsP quantum dot laser," Electron. Lett., 43, 8, 458-460 (Apr. 2007).
Z.G. Lu, J.R. Liu, S. Raymond, P.J. Poole, P.J. Barrios, and D. Poitras, "312-fs pulse generation from a passive C-band InAs/InP quantum dot mode-locked laser," Optics Express 16 (14), 10835-10840 (Jul. 2008).
J.R. Liu, Z.G. Lu, S. Raymond, P.J. Poole, P.J. Barrios, and D. Poitras, "1.6-μm multiwavelength emission of an InAs/InGaAsP quantum dot laser," IEEE Photonics Technology Letters, 20, No. 2, pp. 81-83 (Jan. 2008).
J.R. Liu, Z.G. Lu, S. Raymond, P.J. Poole, P.J. Barrios, and D. Poitras, "Dual-wavelength 92.5 GHz self-mode-locked InP-based quantum dot laser," Optics Letters, vol. 33, No. 15, pp. 1702-1704 (Aug. 2008).
Z.G. Lu, J.R. Liu, P.J. Poole, S. Raymond, P.J. Barrios, D. Poitras, G. Pakulski, P. Grant and D. Roy-Guay, "An L-band monolithic InAs/InP quantum dot mode-locked laser with femtosecond pulses," Optics Express, vol. 17, No. 16, pp. 13609-13614 (Aug. 2009).
Z.J. Jiao, J.R. Liu, Z.G. Lu, X.P. Zhang, P.J. Poole, P.J. Barrios, and D. Poitras, "A C-Band InAs/InP Quantum Dot Semiconductor Mode-Locked Laser Emitting 403-GHz Repetition Rate Pulses," IEEE Photonics Technol. Lett., vol. 23, pp. 543-545, 2011.
Z.G. Lu, J.R. Liu, P.J. Poole, Z.J. Jiao, P.J. Barrios, D. Poitras, J. Caballero, and X.P. Zhang, "Ultra-high repetition rate InAs/InP quantum dot mode-locked lasers," Optics Communications, vol. 284, No. 9, pp. 2323-2326 (May 2011).
Z.G. Lu, J.R. Liu, P.J. Poole, P.J. Barrios, D. Poitras, C.Y. Song, S.D. Chang, J. Weber, L. Mao, H.P. Ding, P. Zhang, P.H. Ma, X.S. Tong, C. Flueraru, and S. Janz, "Coherence comb laser sources: quantum dots, packaging and active control," (Invited paper), The 18th European Conference on Integrated Optics 2016, Warsaw, Poland, May 17-21, 2016.
Z.G. Lu, J.R. Liu, P.J. Poole, C.Y. Song, J. Weber, L. Mao, S.D. Chang, H.P. Ding, P.J. Barrios, D. Poitras and S. Janz, "Integrated InAs/InP quantum dot coherent comb lasers," (Invited paper), SPIE Photonics West 2017, San Francisco, CA, USA, Jan. 28-Feb. 2, 2017.
Regan Watts, Ricardo Rosales, Francois Lelarge, Abderrahim Ramdane, and Liam Barry, "Mode coherence measurements across a 1.5 THz spectral bandwidth of a passively mode-locked quantum dash laser," Optics Letters, vol. 37, 1499-1501 (2012).
T. Habruseva, S. O'Donoghue, N. Rebrova, F. Kéfélian, S. P. Hegarty, and G. Huyet, "Optical linewidth of a passively mode-locked semiconductor laser," Optics Letters, vol. 34, 3307-3309 (2009).
Kristian Zanette, John Cartledge and Maurice O'Sullivan, "Correlation properties of the phase noise between pairs of lines in a quantum-dot optical frequency comb source," In the Proceedings of the Optical Fiber Communication Conference 2017, Th3I.
Akram Akrout, Alexandre Shen, Romain Brenot, Frédéric Van Dijk, Odile Legouezigou, Frederic Pommereau, Francois Lelarge, Abderrahim Ramdane, and Guang-Hua Duan, "Separate Error-Free Transmission of Eight Channels at 10 Gb/s Using Comb Generation in a Quantum-Dash-Based Mode-Locked Laser", IEEE Photonics Technol. Lett., vol. 21, pp. 1746-1748 (2009).
Yousra Ben M'Sallem, Quang Trung Le, Laurent Bramerie, Quoc-Thai Nguyen, Eric Borgne, Pascal Besnard, Alexandre Shen, François Lelarge, Sophie LaRochelle, Leslie A. Rusch, and Jean-Claude Simon, "Quantum-Dash Mode-Locked Laser as a Source for 56-Gb/s DQPSK Modulation in WDM Multicast Applications," IEEE Photonics Technol. Lett., vol. 23, pp. 453-455 (2011).
Regan T. Watts, Stuart G. Murdoch, and Liam P. Barry, "Spectral linewidth reduction of single-mode and mode-locked lasers using a feed-forward heterodyne detection scheme," In the Proceedings of the 2014 Conference on Lasers and Electro-Optics (CLEO 2014), Paper: STh3O.8.
Joerg Pfeifle, Regan Watts, Igor Shkarban, Stefan Wolf, Vidak Vujicic, Pascal Landais, Nicolas Chimot, Siddharth Joshi, Kamel Merghem, Cosimo Calò, Marc Weber, Abderrahim Ramdane, Francois Lelarge, Liam P. Barry, Wolfgang Freude, and Christian Koos, "Simultaneous Phase Noise Reduction of 30 Comb Lines from a Quantum-Dash Mode-Locked Laser Diode Enabling Coherent Tbit/s Data Transmission," In the Proceedings of the Optical Fiber Communication Conference 2015, Paper: Tu3I.5.
P. Marin, J. Pfeifle, J. N. Kemal, S. Wolf, K. Vijayan, N. Chimot, A. Martinez, A. Ramdane, F. Lelarge, W. Freude1, and C. Koos1, "8.32 Tbit/s Coherent Transmission Using a Quantum-Dash Mode-Locked Laser Diode," In the Proceedings of the 2016 Conference on Lasers and Electro-Optics (CLEO 2016), Paper: STh1F.1.

(56) References Cited

OTHER PUBLICATIONS

P. J. Poole, R. L. Williams, J. Lefebvre and S. Moisa, "Using AS/P exchange processes to modify InAs/InP quantum dots", J. Crystal Growth, vol. 257, pp. 89-96, 2003.
P.J. Poole, K. Kaminska, P. Barrios, Z.G. Lu and J.R. Liu, "Growth of InAs/InP-based quantum dots for 1.55 μm laser—applications", J. Crystal Growth, vol. 311, pp. 1482-1486, 2009.
J. N. Kemal, P. Marin-Palomo, K. Merghem, G. Aubin, C. Calo, R. Brenot, F. Lelarge, A. Ramdane, S. Randel, W. Freude, C. Koos, "32QAM WDM Transmission Using a Quantum-Dash Passively Mode-Locked Laser with Resonant Feedback" OFC 2017 @ OSA 2017 Th5C.3.
K. Merghem, V. Panapakkam, Q. Gaimard, F. Lelarge, A. Ramdane, "Narrow Linewidth Frequency Comb Source based on Self-injected Quantum-Dash Passively Mode-Locked Laser" OFC 2017 @ OSA 2017 SW1C.5.

\* cited by examiner

STABLE LINEWIDTH NARROWING OF A COHERENT COMB LASER

FIELD OF THE INVENTION

The present invention relates in general to devices for stable narrowing of linewidths of quantum dot or dash mode-locked coherent comb lasers (CCLs), and in particular to a technique for concurrently narrowing a plurality of mode-locked modes using a self-injection external cavity with high stability.

BACKGROUND OF THE INVENTION

Communication networks need to keep up with the growth of today's Internet data traffic. The telecommunications industry needs new photonics equipment to improve current optical networks and for deployment in next generation optical networks. Semiconductor lasers are among the most important generation components in optical telecommunication systems. Optical linewidth of semiconductor lasers is important because linewidth determines the laser's coherence length and phase noise. The maximum data rate in an optical fiber communications link is determined by the ratio of signal power to noise power as per the Shannon-Hartley equation. Narrow linewidth is an essential requirement for lasers used in high data rate coherent communications, since phase noise impacts signal noise by the coherent detection process. Even non-coherent modulation schemes can suffer from a reduction in signal quality when phase noise is translated into amplitude noise. Thus, lasers for modern optical communications systems now require linewidths of a few hundred KHz or less.

Unfortunately semiconductor lasers typically have linewidths on the order of several to tens of MHz. Consequently, techniques for reducing optical linewidth of semiconductor lasers have been of growing importance since the move to coherent optical communications that has been building over the last decade.

Accordingly, there has been a significant amount of interest in optical coherent comb lasers (CCLs) and their benefits as a source of multiple spectral lines (also known as "tones") in coherent optical fiber communications, because CCLs have been used to create the carrier frequencies in dense wavelength division multiplexing (DWDM) optical systems with net data rates exceeding Terabit/s transmission rates and high spectral efficiency [1-3]. Different techniques have been used to generate multi-wavelength lasers: modulator-based comb sources [3], spatial mode beating within a multimode fiber section [4], multi-cavity oscillation [5], comprising highly nonlinear fibers for spectral broadening [6], or high-Q microresonators [7]. However, these techniques either require complex setups with discrete components, high pump powers with delicate operating procedures, or they provide only a limited number of spectral carriers.

For practical systems, a compact, low-cost, energy-efficient CCL is desired. Applicant developed nanostructured InAs/InP quantum dot (QD) multi-band (multi-colour) multiwavelength mode locked laser, and has demonstrated intraband and inter-band mode-locking (U.S. Pat. No. 7,991,023). Its use as a coherence comb laser (QD-CCL) over a large wavelength range covering C- or L-band has been demonstrated [8-18]. Unlike uniform semiconductor layers in most telecommunication lasers, in the QD CCL, light is emitted and amplified by millions of semiconductor QDs (typically less than 50 nm lateral diameter). Each QD acts like an isolated light source acting independently of its neighbours, and each QD emits light at its own respective wavelength. By providing high efficiency QDs with a desired emission frequency distribution, the CCL is more stable and has much better performance compared to other multi-wavelength lasers. Importantly, a single CCL has been shown to simultaneously produce 50 or more separate lines at spatially distributed wavelengths over the telecommunications C-band or L-band. To achieve these properties we have put considerable effort to design, grow and fabricate InAs/InP QD gain materials and produce CCLs.

More recently Applicant has demonstrated CCLs with repetition rates from 10 to 437 GHz and a total output power up to 50 mW, at room temperature [8-18]. Applicant has investigated relative intensity noises (RINs), phase noises, RF beating signals and other parameters of both filtered individual channels and the whole CCL's output [17-18]. Unfortunately, the single filtered channels of QD CCLs generally exhibit strong phase noise and broad optical linewidths, typically of the order of MHz [17-21]. As a consequence, wavelength-division multiplexing (WDM) data transmission using these CCLs has been restricted to direct detection schemes [22] or differential quadrature phase shift keying (DQPSK), which only uses relatively few (4) symbols. While these CCLs have high symbol rates, their aggregate data rates (up to 504 Gbit/s [23]) are limited by the symbol sets. Coherent transmission can use many more than 4 symbols to achieve higher baud rates, where linewidth allows. The CCLs are not satisfactory for Tbit/s (and higher) coherence optical networking systems.

Furthermore, other uses for CCLs, such as in high precision optical measurement devices or high resolution spectral analysis, are limited by this phase noise.

In order to improve net data transmission rates and spectral efficiency in optical coherent communication systems, researchers have put significant efforts to simultaneously reduce optical linewidth of each individual channel of CCLs. For example, a feed-forward heterodyne scheme has been used to simultaneously reduce the optical linewidth of many comb lines from mode-locked lasers [24-25]. Both [25], and [26] use a local oscillator (LO) and a Mach-Zender Modulator (MZM). The LOs have a narrow linewidth (narrower than the narrowest linewidth achieved by the feed-forward system). These references show the difficulty of producing a large set of comb lines (more than 20) simultaneously narrowed to a high degree (below a few hundred kHz), even when resorting to the relatively complex setups.

Prior art for reducing linewidth of single mode lasers are also known. For example, U.S. Pat. No. 8,804,787 to Coleman et al. claims a particular arrangement for tapping a laser signal from a single mode laser cavity, attenuating the laser signal, and feeding the attenuated (−30 to −80 dB) laser signal back into the laser cavity, where the laser driver provides sufficient drive stability so that a frequency variation of the laser is less than a free spectral range (FSR) of the secondary cavity. This patent specifically identifies as an unexpected result: "that an uncontrolled OPL[Optical Path Length] to the back reflection provided by the first branch provides significant spectral narrowing, which can be several orders of magnitude narrowing". A reduction of linewidth from 118 kHz to 2 kHz was demonstrated for a single wavelength QD laser. "Polarization Maintaining (PM) fiber or non-Polarization Maintaining SM fiber" can be used.

Recent papers [29,30] associated with a European Commission EC-FP7 Big Pipes project demonstrate simultaneous linewidth narrowing of 60 lines in a Quantum Dash mode-locked laser diode using resonant feedback from a secondary cavity, without any LO. The secondary cavity is provided with a freespace optical setup from a backside facet of the mode-locked laser diode that is barely disclosed. Freespace optical waveguides are typically polarization maintaining. Stability of the linewidth is not discussed in any of the prior art references, including these recent papers. Stability is particularly important for commercial deployment of lasers used in telecommunications applications. Given the highly schematic description of the optical system provided in these papers, it is unclear what kind of stability could be provided with their system. Given that "the external cavity length is adjusted to be near a multiple [M] of the optical length of the laser"[30], and a known variably of the laser optical length in operation, it is a safe assumption that the stability is poor outside of highly controlled lab settings. It should be noted that a large OPL for the external cavity (which would be desirable for a large linewidth reduction factor) will require this multiple M to be large. However if M is large, a small variation in the laser's effective OPL (S) will generate a difference MxS in the distance of the reflector from the intended position. The ability to predict or adapt the OPL of the external cavity is not trivial, if possible, and both the OPL of the external cavity and the attenuation have cumulative effects in terms of varying output, leading to a further source of instablility.

Accordingly there is a need for a technique for concurrently narrowing linewidths of a plurality of mode-locked comb lines in a CCL, without relying on a narrow linewidth LO and MZMs, without reducing a number of lines of the CCL, while retaining stability of the narrowed linewidth. Furthermore, there is a need for stably narrowing more linewidths of a CCL, to a greater extent, without complicated and expensive equipment to setup and maintain.

SUMMARY OF THE INVENTION

Applicant has discovered a low-cost and efficient technique for simultaneously narrowing linewidths of coherent comb lasers (CCLs) with improved stability using a polarization maintaining fiber-based secondary cavity. The technique does not rely on narrower linewidth local oscillators (LOs), and Mach-Zender Modulators (MZMs), and can be achieved with less equipment and cost than such techniques. The technique has demonstrably simultaneously reduced the optical linewidth of each of 39 individual channels of a 25 GHz QD CCLs from a few of MHz down to less than 200 kHz, without reducing the number of lines, and has stability far higher than what is possible with with long OPL freespace optics, and secondary cavities composed of non-polarization maintaining single mode fibre.

Accordingly a method for narrowing a linewidth of a coherent comb laser (CCL) is provided. The method involves: providing a mode-locked semiconductor coherent comb laser (CCL) with a laser cavity defined by an active gain material in a waveguide between two facets, the CCL adapted to output of at least 4 mode-locked lines, each with an original linewidth of less than 100 MHz; tapping a fraction of a power from the CCL from the laser cavity to form a tapped beam; propagating the tapped beam to an attenuator to produce an attenuated beam and propagating the attenuated beam back to the laser cavity, on a solid waveguide; and reinserting the attenuated beam into the laser cavity, where the reinserted beam has a power less than 10% of a power of the tapped beam. The reinsertion allows the CCL to be operated to output the mode-locked lines, each with a linewidth of less than 80% of the original linewidth, and an optical path between tapping and reinsertion is polarization maintaining.

The mode-locked semiconductor CCL provided, preferably: is adapted to output at least 10 mode-locked lines; is adapted to output at least 4 mode-locked lines with original linewidths between 10 and 80 MHz; is adapted to output at least 10 mode-locked lines in an optical networking telecommunications band; is electrically pumped; is a ridge waveguide laser with edge facets forming a Fabry-Perot cavity; is one of: a small edge-emitting laser, an external cavity laser, a monolithic (internal-cavity) laser, a diode bar laser, a stacked diode bar laser, a surface-emitting laser (VCSEL), such as an optically pumped surface-emitting external-cavity semiconductor laser (VECSEL), or a quantum cascade laser; or has an active gain material comprising quantum wells, dots, dashes or rods formed of GaAs, AlGaAs, InGaAs, InAs, GaInNAs, GaN, GaP, InGaP, InP, GaInP, or a combination thereof. More specifically, the CCL preferably is adapted to output at least 10 mode-locked lines with original linewidths between 10 and 80 MHz, or between 1 and 30 MHz; is adapted to output at least 25 mode-locked lines in an optical networking telecommunications "C" band; is electrically pumped, controlled by a low noise laser driver, and temperature controlled; or has an active gain material comprising quantum dots, and/or dashes formed of GaAs, AlGaAs, InGaAs, InAs, GaInNAs, GaN, GaP, InGaP, InP, GaInP or a combination thereof.

An optical path length of the secondary cavity is preferably between 5 and 50 m, and the attenuation level is preferably between 15 and 60 dB.

Tapping the CCL preferably comprises: collecting output of a backside facet of the CCL, or providing a coupler to tap a fraction of an output of the CCL.

Reinserting the attenuated beam preferably comprises reinjecting the attenuated beam into the laser cavity via the backside facet, or the coupler.

Propagating the tapped beam to an attenuator preferably comprises: coupling the tapped beam from a bidirectional waveguide path to a unidirectional waveguide circuit including the attenuator; coupling the tapped beam from a bidirectional waveguide path, which includes the attenuator, to a unidirectional waveguide circuit; providing the attenuator on a bidirectional waveguide path that includes a reflector; or providing a partial reflector on the bidirectional waveguide path that serves to both attenuate and reflect the tapped beam.

Coupling the tapped beam is preferably provided by an optical circulator.

The attenuator is preferably a variable optical attenuator.

The attenuator preferably has an attenuation range of at least 10 dB; avoids creating spurious reflections; attenuates each of the lines to somewhat the same degree; and does not vary an OPL of the secondary cavity while changing the degree of attenuation. The attenuator preferably controls light transmission by an aperture variation, with partial occlusion of the beam.

The solid waveguide of the optical path between tapping and reinsertion is preferably provided by single mode optical fibres, a microphotonic chip, a photonic crystal arrangement, or an integrated optical system.

One of the mode-locked lines output preferably has a stability such that over a one hour period, the linewidth does not vary by more than 100 kHz.

Also accordingly, a narrow linewidth multi-wavelength laser (MWL) is provided, comprising: a mode-locked semiconductor coherent comb laser (CCL) with a laser cavity defined by an active gain material in a waveguide between two facets, the CCL adapted to output of at least 4 mode-locked lines, each with an original linewidth of less than 100

MHz; and a secondary cavity coupled to the laser cavity for tapping a beam of the CCL and propagating the tapped beam to an attenuator and reinserting the attenuated beam into the cavity at a power less than 10% of a power of the tapped beam, the secondary cavity consisting of polarization maintaining solid waveguides between polarization maintaining components. A linewidth of each of the at least 4 lines is reduced in proportion to a difference in optical path length between the feedback cavity and the laser cavity.

Preferably the CCL: is adapted to output at least 10 mode-locked lines; is adapted to output at least 4 mode-locked lines with original linewidths between 10 and 80 MHz; is adapted to output at least 10 mode-locked lines in an optical networking telecommunications band; is electrically pumped; is a ridge waveguide laser with edge facets forming a Fabry-Perot cavity; is one of: a small edge-emitting laser, an external cavity laser, a monolithic (internal-cavity) laser, a diode bar laser, a stacked diode bar laser, a surface-emitting laser (VCSEL), such as an optically pumped surface-emitting external-cavity semiconductor laser (VECSEL), or a quantum cascade laser; or has an active gain material comprising quantum wells, dots, dashes or rods formed of GaAs, AlGaAs, InGaAs, InAs, GaInNAs, GaN, GaP, InGaP, InP, GaInP, or a combination thereof. More specifically, the CCL preferably: is adapted to output at least 10 mode-locked lines with original linewidths between 10 and 80 MHz, or between 1 and 30 MHz; is adapted to output at least 25 mode-locked lines in an optical networking telecommunications "C" band; is electrically pumped, controlled by a low noise laser driver, and temperature controlled; or has an active gain material comprising quantum dots, and/or dashes formed of GaAs, AlGaAs, InGaAs, InAs, GaInNAs, GaN, GaP, InGaP, InP, GaInP or a combination thereof.

An optical path length of the secondary cavity is preferably between 5 and 50 m, and the attenuation level is between 15 and 60 dB.

The secondary cavity preferably comprises an optical coupling from one of a backside facet of the CCL, and/or a tap of an output of the CCL via which the beam is tapped and/or reinserted. The secondary cavity preferably comprises: a bidirectional waveguide path coupled to a unidirectional waveguide circuit including the attenuator; a bidirectional waveguide path, including the attenuator, coupled to a unidirectional waveguide circuit; a bidirectional waveguide path that includes a reflector; or a partial reflector on the bidirectional waveguide path that serves to both attenuate and reflect the tapped beam.

The coupling of the tapped beam may be provided by an optical circulator.

The attenuator may be a variable optical attenuator with an attenuation range of at least 10 dB, provisioned to avoid creating spurious reflections, to attenuate each of the lines to somewhat the same degree, and to not vary an OPL of the secondary cavity while changing the degree of attenuation. The attenuator preferably controls light transmission by an aperture variation, with partial occlusion of the beam.

The secondary cavity preferably comprises an optical path between tapping and reinsertion provided by: single mode optical fibres; a free-space optical system; a microphotonic chip; a photonic crystal arrangement; or an integrated optical system.

One of the at least 4 lines preferably has a stability such that over a one hour period, the linewidth does not vary by more than 100 kHz.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which.

DESCRIPTION OF PREFERRED EMBODIMENTS

Herein a cost-effective technique for reducing linewidth of a coherent comb laser (CCL) is described that provides higher stability of the narrowed lines. The technique avoids use of narrow linewidth Local Oscillators and Mach-Zender Modulators, and does not reduce a bandwidth, or number of lines of the CCL, and simultaneously reduces linewidth of a number of mode-locked lines. The technique uses polarization maintaining solid waveguide between at least a multimode laser and attenuator to produce a secondary cavity that is substantially polarization maintaining.

Figure 1:
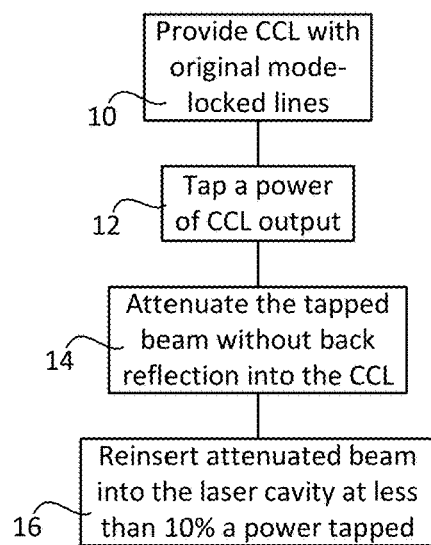
FIG. 1 is a flowchart illustrating principal steps of a method in accordance with an embodiment of the present invention.

FIG. 1 is a schematic illustration of a method for reducing linewidth of mode-locked lines of a CCL, in accordance with the present invention. The method begins at step 10 by providing a CCL that has at least a few, such as 4 mode-locked emission lines (also referred to as emission frequencies, or wavelengths). For telecommunications purposes, preferably the CCL has as many lines as possible within the telecommunication bands, and these are preferably evenly spaced apart. The CCL is preferably electrically pumped, and is a semiconductor laser. The CCL may be a ridge waveguide laser with edge facets forming a Fabry-Perot cavity. The type of semiconductor laser may be: a small edge-emitting laser; an external cavity laser; a monolithic (internal-cavity) laser; a diode bar laser; a stacked diode bar laser; a surface-emitting laser (VCSEL); such as an optically pumped surface-emitting external-cavity semiconductor laser (VECSEL); or a quantum cascade laser. The CCL may have an active material of quantum wells, dots, dashes or rods formed of GaAs, AlGaAs, InGaAs, InAs, GaInNAs, GaN, GaP, InGaP, InP, or GaInP, and more preferably quantum dots or dashes.

A set of the lines of the CCL are mode-locked if driven by a suitable low noise laser driver. Linewidths of these lines are principally determined by phase noise: a variation of the instantaneous line frequency over time. The property of mode-locked lines is that this phase noise varies similarly as a function of time at each of the lines, but the frequency variations at the different lines may vary in amplitude, thus it is common for linewidths to vary gradually, often monotonically, across the spectrum of a mode-locked laser. A range of these linewidths, are important indicators of how much improvement to the modelocking, and to the linewidth (or phase noise, or frequency variation), the present invention can produce, and what Optical Path Length (OPL) the secondary cavity should have, as explained hereinbelow.

At step 14, a CCL output is tapped uniformly across at least the gain spectrum of the mode-locked lines to form a beam. This may be done by either facets of the CCL, or by a beam splitter on the CCL output. The CCL may be a symmetric laser, with identical facet coatings on both ends of the FP cavity, and the tapped beam can be drawn from either laser facet. The power of the tapped beam, relative to the CCL output may be determined by a transmittance of the facet by which the tapped beam is drawn, or by a coupler. Care is taken to ensure that the tapped power forms a beam without reflecting power back into the cavity at different distances from the facet. The tapped beam is transmitted through a polarization maintaining (PM) single mode fiber (SMF) as shown in the system embodiments of the invention herein, although a microphotonic chip with suitable high quality coupling and optical path length could alternatively provide an advantageously integrated optical arrangement. Both PM-SMF and PM microphotonic chips are solid waveguide technology that provide a desired optical path length for the secondary cavity. While it will be appreciated that some part of the secondary cavity may be provided by freespace optics, such as within a preferred variable optical attenuator, or within certain optical circulators, the whole secondary cavity remains PM, and the waveguides are nearly exclusively solid. It should be noted that photonic crystal arrangements may be provided in the PM-SMF or microphotonic chip.

The tapped beam is attenuated in transit through the secondary cavity (step 14) exclusive of the CCL's (primary or FP) cavity. Herein the secondary cavity subsumes the FP cavity and further extends from tap to reinsertion. The attenuation preferably includes at least one controlled attenuator, that allows for varying a degree of attenuation. The controlled attenuator preferably operates in a manner that does not reflect the beam (i.e. avoids creating spurious reflections); attenuates each frequency to somewhat the same degree; and does not vary an OPL of the secondary cavity while changing the degree of attenuation. An aperture-based variable optical attenuator may accomplish this effectively. However, a well-controlled optical path with a fixed attenuation at the right level and the correct optical path length can equally function. Also, as can be gleaned by the equation hereinbelow, control over OPL of the secondary cavity is an equivalent for control over attenuation (in the limiting case of optimized feed-back), although precise control over OPL is more technically challenging than attenuation.

In step 16, the attenuated beam is reinserted into the laser cavity, with at least a decimated power (i.e. at most ⅒th of the power tapped). Herein, all physical ranges and half-ranges for parameters are intended to equally support every subrange thereof. The reinsertion may be via the first or second laser facet.

To design such a system for a given CCL, one must choose the OPL (generally 1-1000 m; more preferably 5-300 m; more preferably 10 to 50 m) and the attenuation level (generally 10-80 dB, more preferably 30-60 dB) of the secondary cavity.

Specifically, selection of $L_{ext}$, the OPL of the secondary cavity, can be made with a CCL once the following parameters of the CCL are known: $L_{cav}$, the OPL of the effective laser cavity; $r_{ext}$, an amplitude reflection coefficient of the external cavity (square root of laser power reflection coefficient across the secondary cavity); $r_{cav}$, an amplitude reflection coefficient of the laser cavity where it joins the secondary cavity; and α, a linewidth enhancement (Henry) factor. It is common knowledge how to measure these parameters. Assuming resonance, the equation relating F, the linewidth narrowing ratio (linewidth optimized with the secondary cavity/linewidth optimized without), with $L_{ext}$ the OPL of the secondary cavity, is:

$$F = \left[1 + \frac{L_{ext}}{L_{cav}} \cdot \frac{r_{ext}}{r_{cav}} \cdot \sqrt{1+\alpha^2} \, (1-r_{cav}^2)\right]^{-2}$$

This equation, though simplified for optimized conditions, allows for estimation of the maximum linewidth narrowing factor. The problem of extending the OPL and attenuation of the secondary cavity across a largest range of lines is non-trivial and depends on many factors that are known to those of skill in the art. In general, an RF beating signal spectrum of the CCL is observed, and if its linewidth is less than a few hundred kHz it is sufficiently mode-locked. Furthermore the optical phase noise of each (or a representative number of) individual lines is assayed to determine the total phase noise. If the optical phase noise of each line is less than 100 MHz, and a variation in optical phase noise across the lines is less than 100 times, the present invention is expected to narrow linewidth by a factor of at least 20%. In general the lower the optical phase noise of the lines, the higher the OPL can be chosen, and the higher the gain factor achievable, subject to the ability to achieve resonant conditions.

Figure 2A:
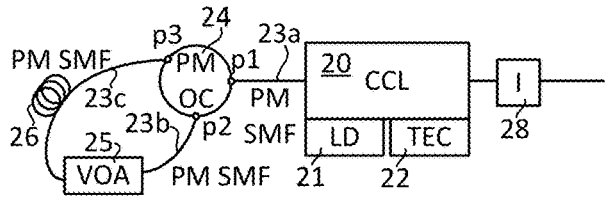
FIG. 2a is a schematic illustration of apparatus accordance with an embodiment of the present invention.

FIG. 2*a* is a schematic illustration of a first embodiment of the present invention. The first embodiment includes a secondary cavity defined at a backside of a CCL 20. Herein frontside of CCL 20 is an end of the laser from which the output is emitted, and backside is opposite the frontside. Herein like features are identified by like reference numerals, and their descriptions are not repeated in each embodiment of the invention, unless to point out a different aspect of the invention.

The CCL 20 is a semiconductor laser controlled and electrically excited by a laser driver 21, and a thermoelectric cooler (TEC) 22. It will be appreciated that the laser driver 21 is optimized for controlling laser output of the CCL 20 with the secondary cavity feedback. The backside is coupled to a first segment of polarization maintaining single mode fibre (PM-SMF) 23a, in a manner well known in the art for avoiding back reflections. The first segment is coupled to port 1 of a polarization maintaining optical circulator (PM-OC) 24. The signal from port 1 is emitted from port 2 of the PM-OC 24 coupled to a second segment of the PM-SMF 23b. The second segment 22b is coupled to a variable optical attenuator (VOA) 25 which attenuates the beam, and forwards the attenuated beam along a third segment of the PM-SMF 23c, which couples to port 3 of the PM-OC 24. One advantage of using a PM-OC is that back reflections to the first segment 23a are essentially precluded. Any reflections entering port 2, whether back reflected from the VOA 25, or cycling through port 3, will substantially exit port 3 in an indefinite, highly attenuated, loop. The attenuated beam received at port 3 is output to port 1 for reinsertion into the CCL cavity, via the first segment 23a. A fixed optical path length of the secondary cavity is provided with a spool 26. An advantage of the location of the spool 26 on the second or third segments is that any coupling (Fresnel) reflection losses are not propagated back to the CCL cavity except via the port 3-port 1 path. An advantage of locating the spool 26 in the first segment, assuming no coupling reflection, is that only half the spool length is needed to provide the OPL.

Figure 2B:
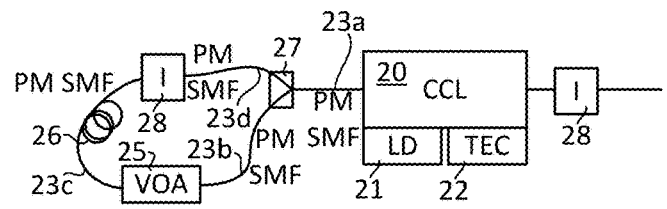
FIG. 2b is a schematic illustration of apparatus accordance with another embodiment of the present invention.

FIG. 2b is a schematic illustration of a second embodiment of the present invention. The second embodiment differs from the first embodiment in that the PM-OC 24 is replaced with a PM coupler 27, and an isolator 28 is placed in the secondary cavity. The PM coupler 27 receives the tapped beam on segment 23a, and may couple with 90% efficiency to segment 23b, or may be a balanced 50-50 1:2 splitter/combiner. Preferably there are no back-reflections. Even a small (0.01%) reflection risks multiplexing multiple OPL feedback signals to the CCL, may spoil the feedback and make the secondary cavity uncontrollable. To the extent that the tapped beam is divided and goes into a back side of the isolator 28, the isolator 28 serves as a secondary attenuator. It will be appreciated that the isolator 28 is described as preventing light coupling from segment 23d to 23a, but it would be equivalent if the isolator operated in the opposite direction. The isolator 28 may be a multi-stage isolator with a high isolation factor. Alternatively, to provide equivalent unidirectivity, a plurality of single stage isolators may be distributed before and after the spool 26, and/or before and after the VOA 25.

Figure 2D:
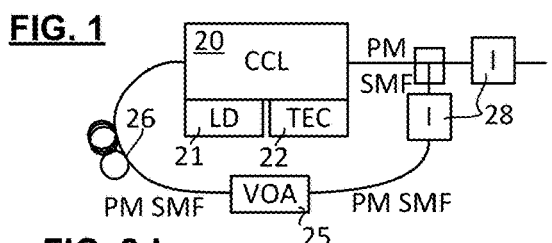
FIG. 2d is a schematic illustration of apparatus accordance with another embodiment of the present invention.
Figure 2C:
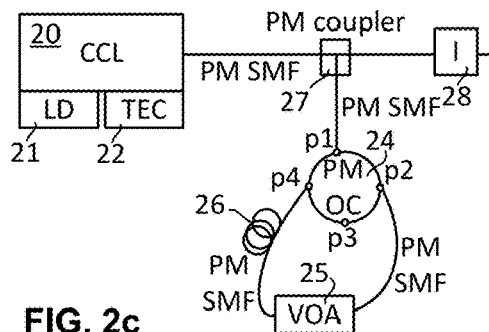
FIG. 2c is a schematic illustration of apparatus accordance with another embodiment of the present invention.

FIG. 2c is a variant of the first embodiment, with an added PM coupler 27 is used to permit the secondary cavity to branch from a laser output on the frontside of the CCL cavity. The coupler 27 is preferably a 90:10 coupler that sends 90% of the light to an isolator 28 for emission of the laser. The isolator 28, preferably a multi-stage isolator, is provided on the frontside to prevent back reflections from the laser as used, from affecting laser stability, as is conventional on such lasers. The PM-OC 24 of FIG. 2c is a 4-port circulator, in which any beam that is not transmitted from port a to port a+1, exits at port a+2. By skipping port 3 in this setup, any component of the tapped beam that is not sent to the VOA 25, is withdrawn via port 3. Any attenuated beam that is not coupled back to port 1, is re-attenuated at the VOA 25 and will have negligible effect on the CCL 20 with twice the attenuation.

While FIG. 2c subsumes essentially the embodiment of FIG. 2a, the ring could alternatively be provided as per the embodiment of FIG. 2b, if a 1 by 3 coupler is used instead of the 1 by 2 coupler, or two 1 by 2 couplers are used in series from the laser output.

Furthermore, as shown in FIG. 2d, the tapped beam may be from the frontside of the CCL 20, and the reinsertion can be into the backside of the CCL 20. By switching a direction of the isolator, the opposite is provided, and is equally feasible.

Figure 2E:
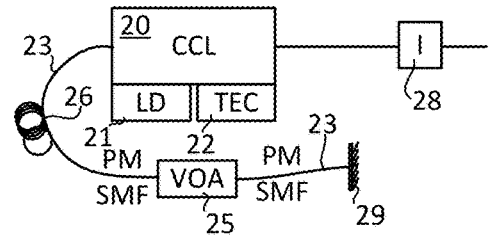
FIG. 2e is a schematic illustration of apparatus accordance with another embodiment of the present invention.

FIG. 2e schematically illustrates a full duplex embodiment of the secondary cavity. No isolator or circulator is used, but retroreflection is provided by a mirror 29. The mirror 29 may be a partially reflective, or highly reflective coated end of the fibre with suitable attention to preventing other light from entering the coated end.

Figure 2F:
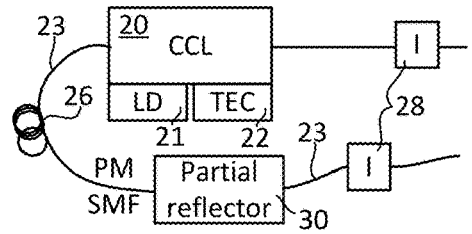
FIG. 2f is a schematic illustration of apparatus accordance with another embodiment of the present invention.

FIG. 2f is similar to FIG. 2e but uses a partial reflector 30 with a known and controlled fractional reflectivity and fractional transmissivity. The transmitted beam is lost to the secondary cavity, and isolator 28 prevents any further reflections from entrance into the system. This set up requires a controlled but fixed OPL opposed to the VOA 25, to induce retroreflection, which has the disadvantage of not permitting any reconfiguration after initial set up and calibration of the CCL, other than what can be achieved by varying the laser driver 21's injection. After this retroreflection, an isolator 28 is provided to prevent further reflections from entering into the secondary cavity.

In the previous embodiments, the features used in one embodiment can generally be added or replaced with those of other embodiments without departing from the intended range of embodiments illustrative of the present invention.

EXAMPLES

Figure 3A:
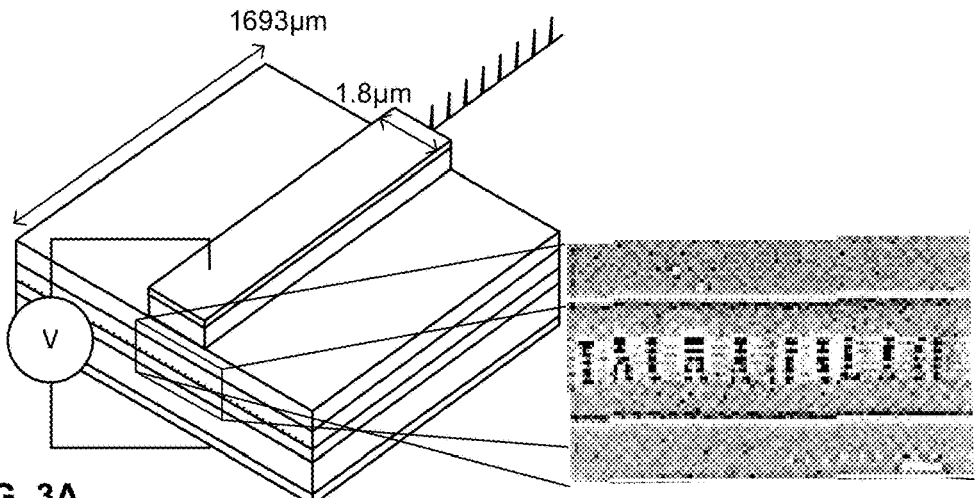
FIG. 3A pertains to a CCL used to demonstrate the present invention, in particular 3A is a schematic illustration of a mode-locked InAs/InP Quantum Dash CCL used for the demonstration of the present invention with a micrograph inset.

FIG. 3A is a schematic illustration of the InAs/InP Quantum Dash CCL used for the demonstration of the linewidth narrowing with a secondary cavity. The InAs/InP QD CCL was grown by chemical beam epitaxy (CBE) on exactly (100) oriented n-type InP substrates. The undoped active region of the QD sample consisted of five stacked layers of InAs QDs with $In_{0.816}Ga_{0.184}As_{0.392}P_{0.608}$ (1.15Q) barriers. The QDs could be tuned to operate in the C- or L-band using a QD double cap growth procedure and a GaAs sublayer [27-28]. In the double cap process the QDs are partially capped with a thin layer of InP, followed by a 30 second growth interruption and then complete capping with the 1.15Q barrier material. A thickness of the partial cap controls a height of the QDs, and hence their emission wavelength, and is also narrows the height distribution of the QDs, resulting in a narrower 3-dB gain spectrum. The thin GaAs sublayer promotes dash rather than dot growth. This active layer was embedded in a 355 nm thick 1.15Q waveguiding core, providing both carrier and optical confinement. The waveguiding core was surrounded by p-doped (top) and n-doped (bottom) layers of InP and capped with a heavily doped thin InGaAs layer to facilitate the fabrication of low resistance Ohmic contacts.

This sample was fabricated into a single lateral mode ridge waveguide laser with a ridge width of 1.8 µm, and then cleaved to form a F-P laser cavity for the CCL. A laser cavity with length 1693 µm was produced for the CCL. The output of this CCL was coupled to an anti-reflection (AR) coated lensed fiber followed by a two-stage C-band optical isolator to reduce any back-reflection to the QD CCL. The laser was driven with a DC injection current using a low noise laser driver (ILX Lightwave model LDX-3620B), and tested with a heat sink maintained at 20° C. using a thermoelectric cooler (Melcor).

Figure 3B:
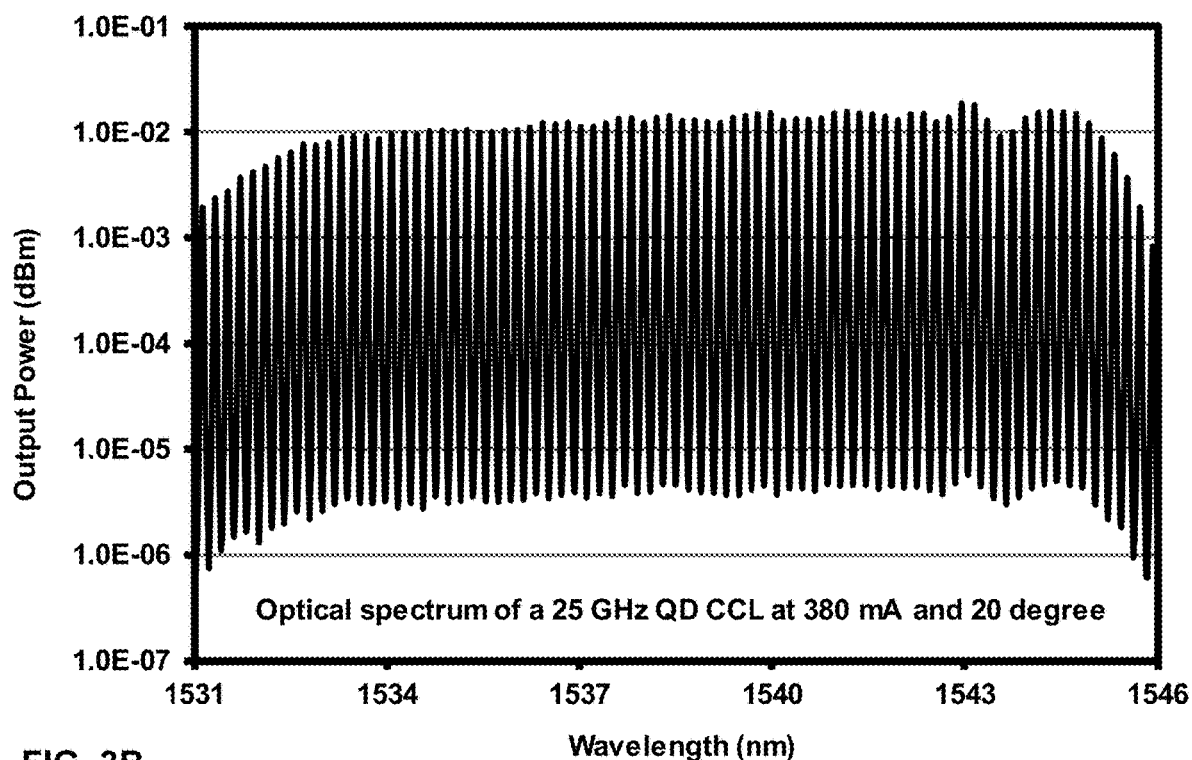
FIG. 3B also pertains to a CCL used to demonstrate the present invention: 3B shows laser output spectrum showing the characteristic comb output of the same CCL.

The performance of the QD CCL was characterized using an optical spectrum analyzer (Anritsu MS9740A), a 50 GHz (max.) PXA signal analyzer (Keysight Technologies Model N9030A), a 45 GHz IR photodetector (New Focus Model-1014), an optical autocorrelator (Femtochrome Research Inc. FR-103HS), a delayed self-heterodyne interferometer (Advantest Q7332 and R3361A), an OE4000 automated laser linewidth/phase noise measurement system (OEWaves Inc.) and power meters (Newport 840, ILX Lightwave FPM-8210H and OMM-6810B). FIG. 3B shows 58 lines output by the laser with the optical spectrum analyzer.

L-I-V curves were measured for the CCL, and the lasing threshold current was found to be 48 mA, with a slope efficiency of 0.13 mW/mA. The following properties were obtained for the CCL in its original state: active length: 1693 µm; frequency spacing: 25 GHz; injection current: 380 mA; temperature: 20° C.; center wavelength: 1537.7 nm; 3-dB bandwidth: ~10.46 nm; and channels with the optical signal-to-noise ratio (OSNR) of more than 35 dB:at least 39. The laser's series resistance is 1.46 Ohm. The optical average output power measured by a large area detector is 42 mW in these conditions. The optical linewidth of each individual channel is from ~1 MHz to 4.5 MHz between 1542.92 nm to 1532.46 nm over the 53 channels, as graphically shown in FIG. 4.

While this CCL is excellent—all laser channels with excellent OSNR are very stable because of highly inhomogeneous QD gain broadening due to statistically distributed sizes/geometries, composition and environment of self-assembled QDs—experimental results have clearly shown that the optical linewidth of the single filtered channels of 1-4.5 MHz is not good enough for: terabit/s (or better) coherence optical networking systems; high precision optical measurement; or high resolution spectral analysis. In order to narrow the optical linewidth of every individual channel of the QD CCLs, the simple external cavity, self-feedback system was invented.

The secondary cavity substantially as shown in FIG. 2c was used to demonstrate this invention, but with a 3 port PM OC. The frontside laser output of the QD MWL was optically coupled to an anti-reflection (AR) coated lensed polarization-maintaining (PM) single-mode fiber (SMF), followed by a two-stage optical isolator to prevent reflection back to laser cavity from the measurement system. Naturally the TE alignment of the laser output was aligned with the polarization angle of the PM-SMF. The backside facet of the QD CCL was optically coupled to another AR-coated lensed PM-SMF (23a) connected with port 1 of the PM optical circulator (OC) (Lightstar Inc. Model: PM0C-1550-B-900-5-0-0.8 5.5×35 mm FC/APC X3). The VOA 25 was a PM VOA based on a mechanical aperture to occlude part of the tapped beam without inducing any optical path change while adjusting attenuation. The VOA 25 is (Lightstar Inc. Model: PMVOA-1550-I-900-5-0-0.8 26×18×8 FC/APC X2) is adapted to attenuate 1%-99% of a power of the tapped beam.

The secondary ring optical PM fiber cavity thus produced a self-injected optical feedback cavity that is weakly coupled to the laser cavity for tapping a fraction of a power via a backside of the QD CCL and reinserting it with an estimated power of $10^{-3}$ to $10^{-5}$ of that of the tapped beam.

The schematic in FIG. 2c shows a spool 26 of a fixed length chosen to provide an OPL for the secondary cavity, however, the three lengths of PM-SMF extended from the PM-OC, along with the PM OC between the CCL and coupler 27 were sufficient to produce the 11 m OPL required. Thus the spool 26 was distributed in this instance. The secondary ring PM fiber cavity had an OPL of a few thousand times longer than the ~1.7 mm cavity length of the QD CCL was found to produce a very strong linewidth narrowing function of an ultra-narrow filter. In this case the laser power fed back via the secondary cavity is used to improve laser locking, bringing about significant narrowing of the laser emitting spectrum.

After the CCL was coupled to the secondary cavity, it's power characteristics were altered, and the ultra-low noise driver was re-optimized for the new laser characteristics. In a manner known in the art the OPL of the laser cavity was varied to rematch a phase of the cavity for the secondary cavity feedback.

Figure 4A:
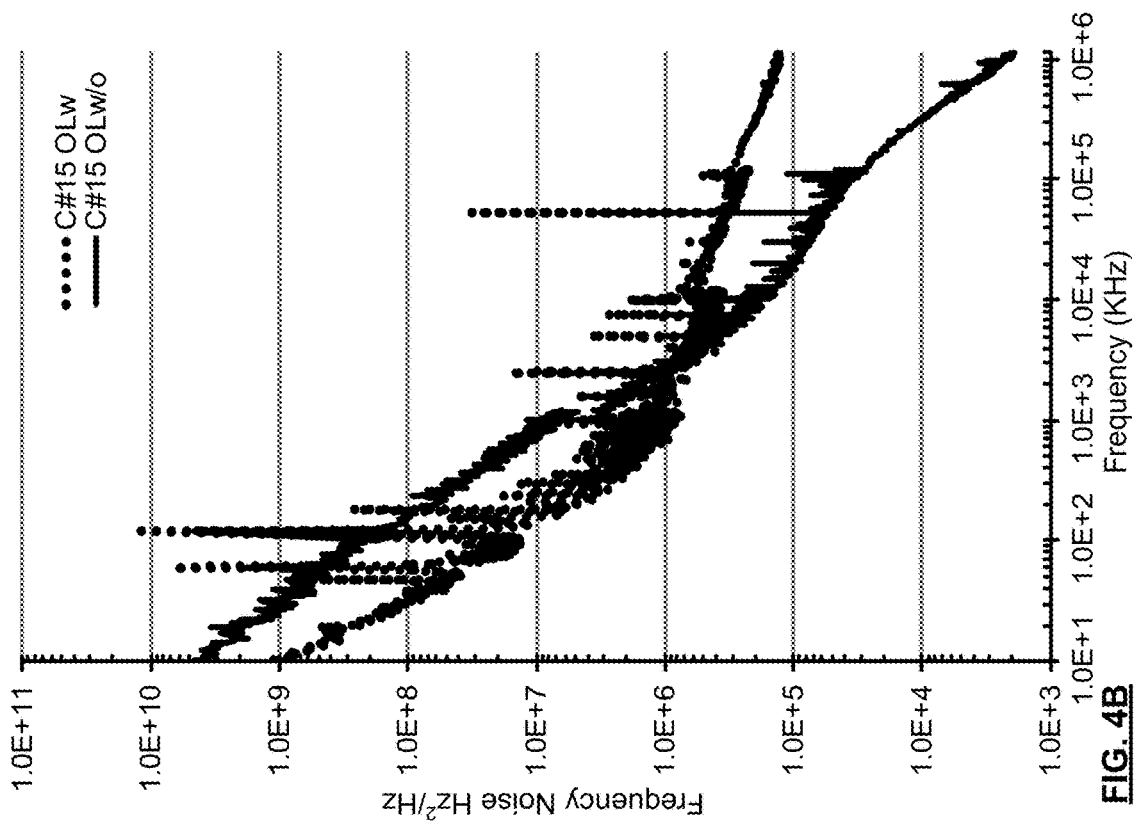
FIG. 4A is a graph, in conjunction with 4b, comparing single line optical noise spectra for optimized driven CCL in comparison with the same CCL with secondary cavity self-feedback respectively for the $1^{st}$ and $15^{th}$ lines of the CCL.
Figure 4B:
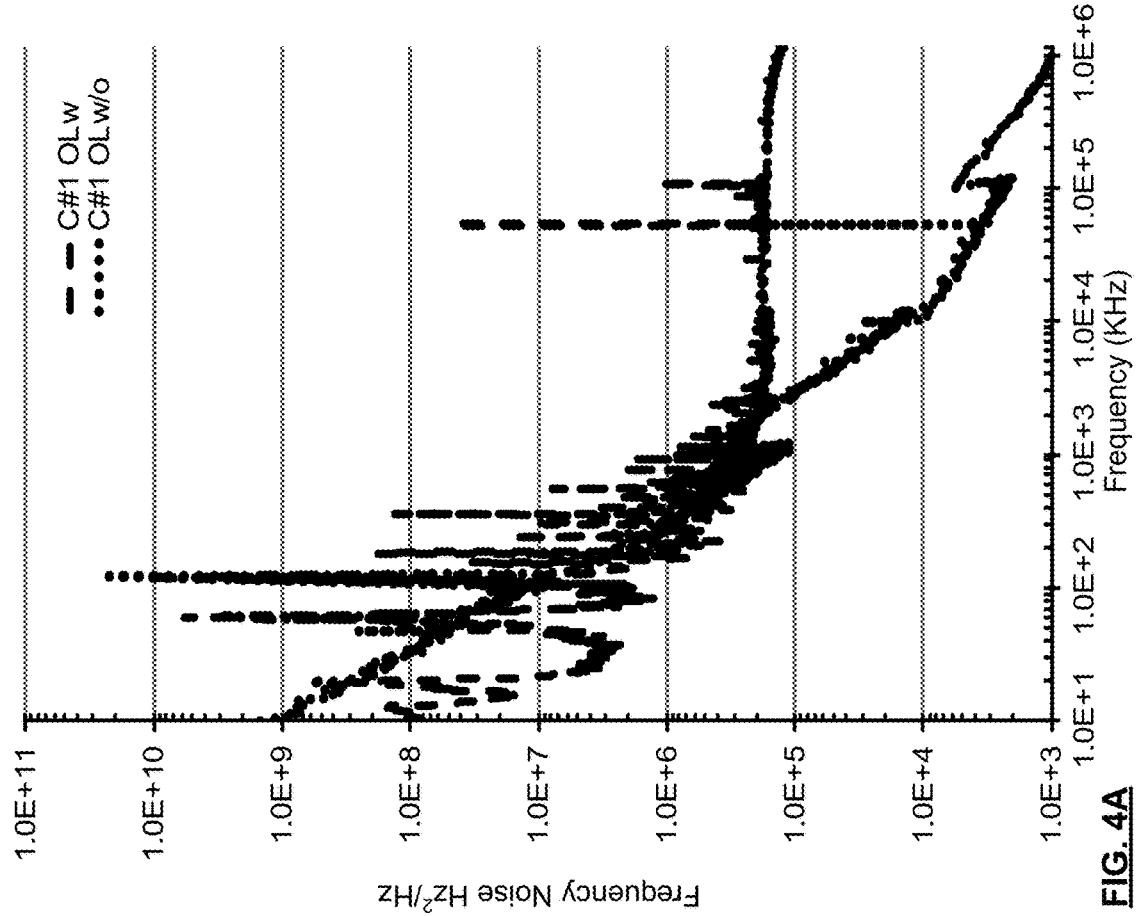
FIG. 4B is also a graph, in conjunction with 4A, comparing single line optical noise spectra for optimized driven CCL in comparison with the same CCL with secondary cavity self-feedback respectively for the $1^{st}$ and $15^{th}$ lines of the CCL.

FIGS. 4A,B are both graphical comparisons of single line's phase noise for an optimized driven laser with and without the secondary cavity self-feedback. FIG. 4A shows the first line, which is around 1545 nm (see FIG. 3B) and already has a narrowest linewidth without secondary cavity self-feedback (labeled C #1 OLw). This noise profile shows a many-peaked, generally higher amplitude phase noise below 1 MHz, with a general decrease in amplitude as frequency increases, but after about 1 MHz, the phase noise amplitude flattens out. In contrast the phase noise of the same channel with secondary cavity self-feedback (labelled C #1 OLw/o) has a substantially worse noise profile below 1 MHz, but an improved noise profile above 1 MHz that more than offsets the losses below 1 MHz. It will be appreciated by those of ordinary skill, that low frequency phase noise is readily compensated by low noise drivers of current semiconductor lasers. It therefore is clear from this graphical comparison that the $1s^t$ channel will be improved by a suitable driver.

FIG. 4B shows again that for the $15^{th}$ channel, that above 1 MHz, the noise amplitude of the line with the secondary cavity self-feedback (C #15 OLw/o) is appreciably lower for a typical line.

Figure 5:
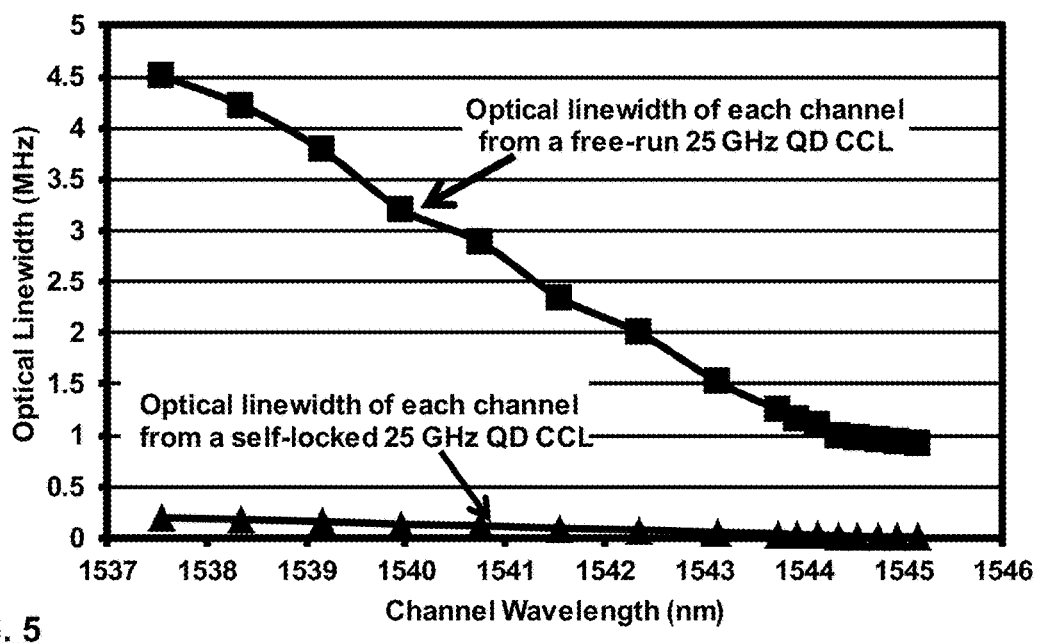
FIG. 5 is a linear graph showing linewidth of a CCL with optimized driving without and with a secondary cavity self-feedback.

FIG. 5 is a graphical representation of linewidths of measured lines of the CCL with optimized drivers, showing lines without the secondary cavity self-feedback having linewidths of 0.9-4.5 MHz corresponding with lines with the secondary cavity self-feedback with linewidths of less than 200 kHz.

Table 1 lists measured channel numbers (C #), wavelength (in nm), optical linewidth without secondary cavity self-feedback (0Lw/o) in MHz, optical linewidth with secondary cavity self-feedback (OLw), in MHz, and the reduction ratio (Ratio). This is the data graphed in FIG. 5. It clearly shows the improvement to mode-locking produced by the secondary cavity self-feedback which has its greatest effect for lowest line numbers.

| C# | Wavelength | OLw/o | OLw | Ratio |
|---|---|---|---|---|
| 1 | 1545.14 | 0.92 | 0.012 | 76.67 |
| 2 | 1544.94 | 0.93 | 0.013 | 71.54 |
| 3 | 1544.741 | 0.95 | 0.015 | 63.33 |
| 4 | 1544.54 | 0.97 | 0.017 | 57.06 |
| 5 | 1544.3395 | 1 | 0.024 | 41.67 |
| 6 | 1544.139 | 1.1 | 0.03 | 36.67 |
| 7 | 1543.94 | 1.16 | 0.035 | 33.14 |
| 8 | 1543.741 | 1.25 | 0.044 | 28.41 |

-continued

| C# | Wavelength | OLw/o | OLw | Ratio |
|---|---|---|---|---|
| 11 | 1543.142 | 1.52 | 0.056 | 27.14 |
| 15 | 1542.343 | 2 | 0.08 | 25.00 |
| 19 | 1541.55 | 2.34 | 0.095 | 24.63 |
| 23 | 1540.75 | 2.89 | 0.121 | 23.88 |
| 27 | 1539.951 | 3.21 | 0.136 | 23.60 |
| 31 | 1539.151 | 3.79 | 0.162 | 23.40 |
| 35 | 1538.352 | 4.22 | 0.182 | 23.19 |
| 39 | 1537.552 | 4.51 | 0.198 | 22.78 |

Linewidths of individual channels of the CCL as a function of wavelength, for both the original CCL, and the CCL with the secondary cavity show the remarkable reduction in linewidth, especially for higher wavelength lines. Reduction of the laser linewidths is dramatic: for example the line near 1538.5 nm shows a reduction factor of about 35 (the linewidth with secondary cavity is about 3% the linewidth without). All of the lines from 1537.5-1545 originally had linewidths above about 0.9 MHz, are now well less than 200 kHz, varying from about 1.2% to 4.4% of the original (without secondary cavity) feedback.

Figure 6:
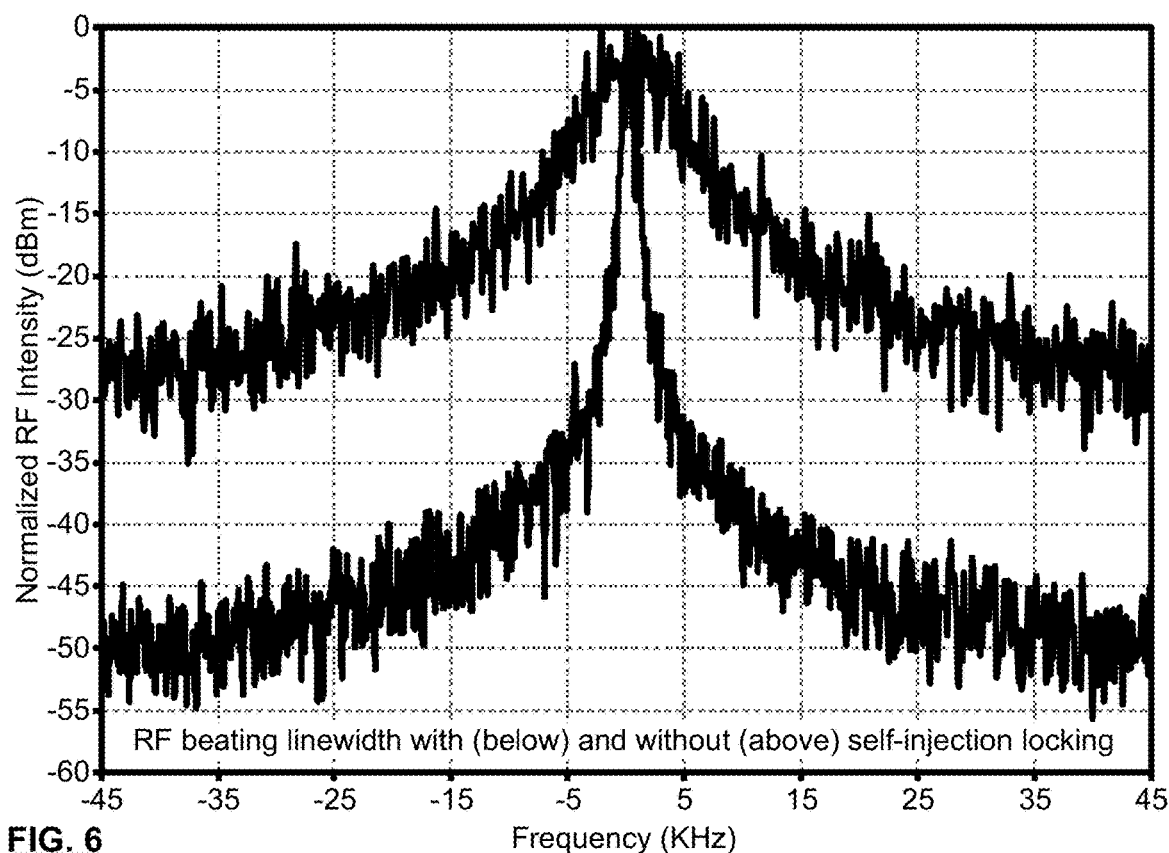
FIG. 6 is a graph showing normalized RF beating signal spectra for optimized driven CCL in comparison with the same CCL with secondary cavity self-feedback.

Normalized RF beating signal spectra, with and without self-injection feedback, is further plotted in FIG. 6. The RF beating signal spectra particularly illustrate the non-common mode noise properties of the lines, in that any co-variation of the lines are not represented, as the lines beat against each other, (if they co-vary, this variation is filtered out). The RF beating signals show a substantially narrower peak, and lower baseline (~−50 dB) with the self-injection feedback, as opposed to the original output of the CCL, which has a baseline of about −27 dB. The RF beating signals with small RF full width at half maximum (fwhm: ~300 Hz), clearly shows that the phase fluctuations of their longitudinal modes are synchronized and correlated, as expected in a phase-mode-locked laser.

While the foregoing improvements to linewidth are in line with prior art linewidth improvements using secondary cavity self-feedback, the present invention provides that these linewidths are highly stable. High speed measurement of phase noise using heterodyne detectors can show similar phase noise improvements, without purporting to provide stability of the linewidth.

Figure 7:
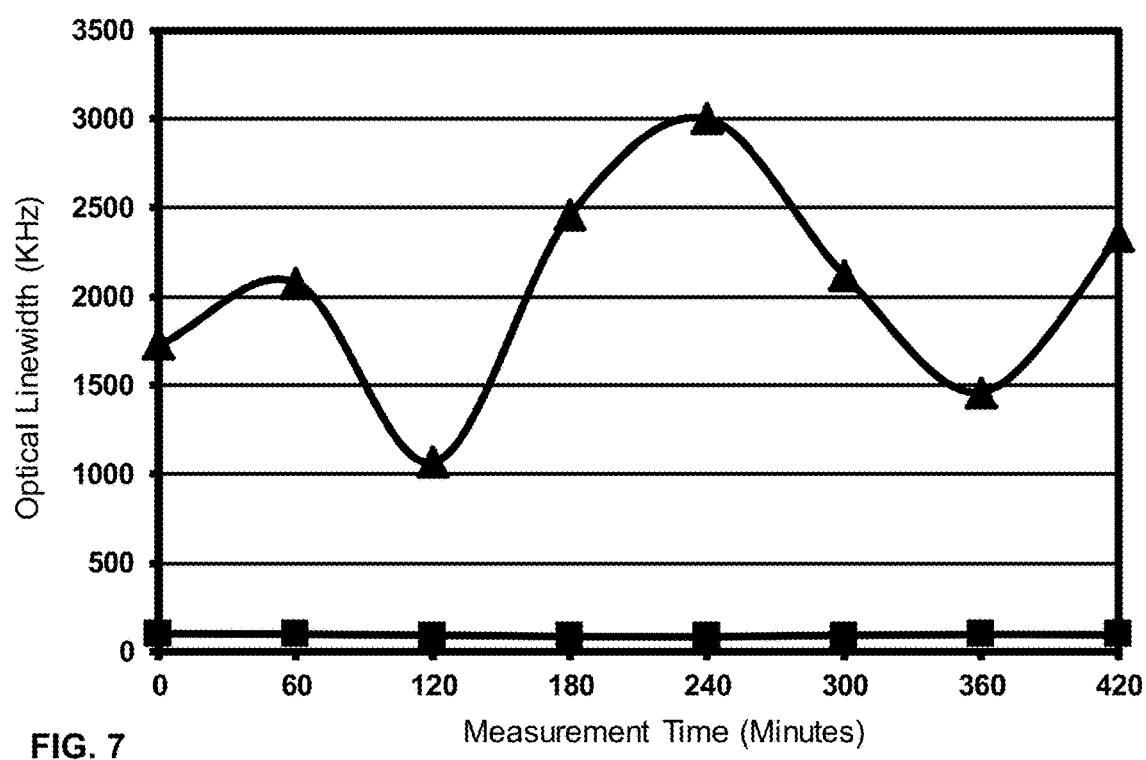
FIG. 7 is a graph showing optical linewidth as a function of time of an individual channel from a self-locked 25 GHz QD CCL comparing a polarization maintaining secondary cavity with a non-polarization maintaining secondary cavity.

In order to show the variability, FIG. 7 graphs 8 measurements using homodyne detection (OEWaves Inc. OE 4000 TM). Each measurement produced a scan as shown in FIG. 4A,B over a period of about 15 minutes. The same secondary cavity and CCL were used, except for the components being replaced with polarization maintaining solid waveguides (bottom plot identified with squares) vs. non-polarization maintaining solid waveguides (top plot triangles). As mentioned above, if a heterodyne or self-homodyne measurement is performed, a very small sample time is required, and a measured linewidth approaching the square plot can be obtained, however subsequent measurements, even within minutes, will not show the same value.

In general, the experiments were performed for both PM and non-PM solid waveguide secondary cavities with monitored feedback power to keep the same intensity (some measurements involved realigning the current unpackaged CCL prior to measurement). The operation conditions are 330 mA and 20° C., as before. The tested individual channel's wavelength is 1540 nm.

The PM solid waveguide secondary cavity clearly shows both a far lower linewidth, and far less variation. The specific 8 data points provided for both PM solid waveguide secondary cavities show a range of 0.9-8.3 kHz difference between measurements separated by 1 hour (start time to start time). The mean difference between measurements is 4.9 kHz, and the standard deviation of the 8 values is 5.9 kHz. The non-PM data points show a range of 350-1395 kHz between successive measurements. The mean difference is 820 kHz, and the standard deviation of the 8 values is 570 kHz. Accordingly, it is observed that using PM solid waveguide secondary cavity self-feedback, a linewidth of the laser cavity can be improved by at least 20%, and have a stability such that over one hour the linewidth does not vary by more than 100 kHz, more preferably by more than 80 kHz, more preferably by more than 40 kHz, 20 kHz, or about 5 kHz on average.

Applicant notes that stability over larger periods have been performed, and the PM-SMF secondary cavity self-feedback has been shown to be very stable over even longer periods.

REFERENCES

1. V. Ataie, E. Temprana, L. Liu, E. Myslivets, B. P.-P. Kuo, N. Alic, and S. Radic, "Flex-grid compatible ultrawide frequency comb source for 31.8 Tb/s coherent transmission of 1520 UDWDM channels," In the Proceedings of The Optical Fiber Communication Conference 2014, Postdeadline Paper, Th5B.7;
2. Joerg Pfeifle, Victor Brasch, Matthias Lauermann, Yimin Yu, Daniel Wegner, Tobias Herr,Klaus Hartinger, Philipp Schindler, Jingshi Li, David Hillerkuss, Rene Schmogrow, Claudius Weimann, Ronald Holzwarth, Wolfgang Freude, Juerg Leuthold, Tobias J. Kippenberg and Christian Koos, "Coherent terabit communications with microresonator Kerr frequency combs," Nature Photonics, Vol. 8, 375-380 (2014);
3. C. Weimann, P. C. Schindler, R. Palmer, S. Wolf, D. Bekele, D. Korn, J. Pfeifle, S. Koeber, R. Schmogrow, L. Alloatti, D. Elder, H. Yu, W. Bogaerts, L. R. Dalton, W. Freude, J. Leuthold, and C. Koos, "Silicon-organic hybrid (SOH) frequency comb sources for terabit/s data transmission," Optics Express, vol. 22, 3629-3637 (2014);
4. Z. G. Lu, F. G. Sun, G. Z. Xiao, P. Lin, and P. Zhao, "High-power multiwavelength Er3+−Yb3+ codoped double-cladding fiber ring laser," IEEE Photon., Technol. Lett., Vol. 17, (9), pp.1821-1823, 2005;
5. Z. G. Lu, and C. P. Grover, "A widely tunable narrow-linewidth triple-wavelength erbium-doped fiber ring laser," IEEE Photon. Technol. Lett., Vol. 17, (1), pp.22-24, 2005;
6. B. J. Puttnam, R. S. Luis, W. Klaus, J. Sakaguchi, J.-M. Delgado Mendinueta, Y. Awaji, N. Wada, Yoshiaki Tamura, Tetsuya Hayashi, Masaaki Hirano and J. Marciante, "2.15 Pb/s Transmission Using a 22 Core Homogeneous Single-Mode Multi-Core Fiber and Wideband Optical Comb," In the Proceedings of the 2015 European Conference on Optical Communication (ECOC 2015), Postdeadline Paper 3.1;
7. J. Pfeifle, A. Kordts, P. Marin, M. Karpov, M. Pfeiffer, V. Brasch, R. Osenberger, J. Kemal, S. Wolf, W. Freude, T. J. Kippenberg, and C. Koos, "Full C and L-Band Transmission at 20 Tbit/s Using Cavity-Soliton Kerr Frequency Combs," In the Proceedings of the 2015 Conference on Lasers and Electro-Optics (CLEO 2015), Postdeadline Paper: jTh5C.8;
8. J. R. Liu, Z. G. Lu, S. Raymond, P. J. Poole, P. J. Barrios, G. Pakulski, D. Poitras, G. Z. Xiao, and Z. Y. Zhang, "Uniform 90-channel multiwavelength InAs/InGaAsP quantum dot laser," Electron. Lett., 43, 8, 458-460 (April 2007);

9. Z. G. Lu, J. R. Liu, S. Raymond, P. J. Poole, P. J. Barrios, and D. Poitras, "312-fs pulse generation from a passive C-band InAs/InP quantum dot mode-locked laser," Optics Express 16 (14), 10835-10840 (July 2008);
10. J. R. Liu, Z. G. Lu, S. Raymond, P. J. Poole, P. J. Barrios, and D. Poitras, "1.6-μm multiwavelength emission of an InAs/InGaAsP quantum dot laser," IEEE Photonics Technology Letters, 20, No .2, pp. 81-83 (January 2008);
11. J. R. Liu, Z. G. Lu, S. Raymond, P. J. Poole, P. J. Barrios, and D. Poitras, "Dual-wavelength 92.5 GHz self-modelocked InP-based quantum dot laser," Optics Letters, Vol. 33, No. 15, pp. 1702-1704 (August 2008).
12. Z. G. Lu, J. R. Liu, P. J. Poole, S. Raymond, P. J. Barrios, D. Poitras, G. Pakulski, P. Grant and D. Roy-Guay, "An L-band monolithic InAs/InP quantum dot mode-locked laser with femtosecond pulses," Optics Express, Vol. 17, No. 16, pp.13609-13614 (August, 2009).
13. Z. G. Lu, J. R. Liu, S. Raymond, P. J. Poole, P. J. Barrios, and D. Poitras, "Quantum-dot-based semiconductor waveguide devices," U.S. Pat. No. 7,769,062B2 (3 Aug. 2010).
14. Z. J. Jiao, J. R. Liu, Z. G. Lu, X. P. Zhang, P. J. Poole, P. J. Barrios, and D. Poitras, "A C-Band InAs/InP Quantum Dot Semiconductor Mode-Locked Laser Emitting 403-GHz Repetition Rate Pulses," IEEE Photonics Technol. Lett., vol. 23, pp. 543-545, 2011.
15. J. R. Liu, Z. G. Lu, S. Raymond, P. J. Poole, P. J. Barrios, and D. Poitras, "Multiband multiwavelength mode-locking lasers," U.S. Pat. No. 7,991,023B2, (2 Aug. 2011).
16. Z. G. Lu, J. R. Liu, P. J. Poole, Z. J. Jiao, P. J. Barrios, D. Poitras, J. Caballero, and X. P. Zhang, "Ultra-high repetition rate InAs/InP quantum dot mode-locked lasers," Optics Communications, Vol. 284, No. 9, pp. 2323-2326 (May 2011).
17. Z. G. Lu, J. R. Liu, P. J. Poole, P. J. Barrios, D. Poitras, C. Y. Song, S. D. Chang, J. Weber, L. Mao, H. P. Ding, P. Zhang, P. H. Ma, X. S. Tong, C. Flueraru, and S. Janz, "Coherence comb laser sources: quantum dots, packaging and active control," (Invited paper), The 18th European Conference on Integrated Optics 2016, Warsaw, Poland, 17-21 May 2016.
18. Z. G. Lu, J. R. Liu, P. J. Poole, C. Y. Song, J. Weber, L. Mao, S. D. Chang, H. P. Ding, P. J. Barrios, D. Poitras and S. Janz, "Integrated InAs/InP quantum dot coherent comb lasers," (Invited paper), SPIE Photonics West 2017, San Francisco, Calif., USA, 28 Jan.-2 Feb. 2017.
19. Regan Watts, Ricardo Rosales, Francois Lelarge, Abderrahim Ramdane, and Liam Barry, "Mode coherence measurements across a 1.5 THz spectral bandwidth of a passively mode-locked quantum dash laser," Optics Letters, Vol. 37, 1499-1501 (2012).
20. T. Habruseva, S. O'Donoghue, N. Rebrova, F. Kéfélian, S. P. Hegarty, and G. Huyet, "Optical linewidth of a passively mode-locked semiconductor laser," Optics Letters, Vol. 34, 3307-3309 (2009).
21. Kristian Zanette, John Cartledge and Maurice O'Sullivan, "Correlation properties of the phase noise between pairs of lines in a quantum-dot optical frequency comb source," In the Proceedings of The Optical Fiber Communication Conference 2017, Th3I.
22. Akram Akrout, Alexandre Shen, Romain Brenot, Frédéric Van Dijk, Odile Legouezigou, Frederic Pommereau, Francois Lelarge, Abderrahim Ramdane, and Guang-Hua Duan, "Separate Error-Free Transmission of Eight Channels at 10 Gb/s Using Comb Generation in a Quantum-Dash-Based Mode-Locked Laser," IEEE Photonics Technol. Lett., vol. 21, pp. 1746-1748 (2009).
23. Yousra Ben M'Sallem, Quang Trung Le, Laurent Bramerie, Quoc-Thai Nguyen, Eric Borgne, Pascal Besnard, Alexandre Shen, Francois Lelarge, Sophie LaRochelle, Leslie A. Rusch, and Jean-Claude Simon, "Quantum-Dash Mode-Locked Laser as a Source for 56-Gb/s DQPSK Modulation in WDM Multicast Applications," IEEE Photonics Technol. Lett., vol. 23, pp. 453-455 (2011).
24. Regan T. Watts, Stuart G. Murdoch, and Liam P. Barry, "Spectral linewidth reduction of single-mode and mode-locked lasers using a feed-forward heterodyne detection scheme," In the Proceedings of the 2014 Conference on Lasers and Electro-Optics (CLEO 2014), Paper: STh3O.8.
25. Joerg Pfeifle, Regan Watts, Igor Shkarban, Stefan Wolf, Vidak Vujicic, Pascal Landais, Nicolas Chimot, Siddharth Joshi, Kamel Merghem, Cosimo Calò, Marc Weber, Abderrahim Ramdane, Francois Lelarge, Liam P. Barry, Wolfgang Freude, and Christian Koos, "Simultaneous Phase Noise Reduction of 30 Comb Lines from a Quantum-Dash Mode-Locked Laser Diode Enabling Coherent Tbit/s Data Transmission," In the Proceedings of The Optical Fiber Communication Conference 2015, Paper: Tu3I.5.
26. P. Marin, J. Pfeifle, J. N. Kemal, S. Wolf, K. Vijayan, N. Chimot, A. Martinez, A. Ramdane, F. Lelarge, W. Freude1, and C. Koos1, "8.32 Tbit/s Coherent Transmission Using a Quantum-Dash Mode-Locked Laser Diode," In the Proceedings of the 2016 Conference on Lasers and Electro-Optics (CLEO 2016), Paper: STh1F.1.
27. P. J. Poole, R. L. Williams, J. Lefebvre and S. Moisa, "Using As/P exchange processes to modify InAs/InP quantum dots", J. Crystal Growth, Vol. 257, pp. 89-96, 2003.
28. P. J. Poole, K. Kaminska, P. Barrios, Z. G. Lu and J. R. Liu, "Growth of InAs/InP-based quantum dots for 1.55 μm laser applications," J. Crystal Growth, Vol. 311, pp. 1482-1486, 2009.
29. J. N. Kemal, P. Marin-Palomo, K. Merghem, G. Aubin, C. Calo, R. Brenot, F. Lelarge, A. Ramdane, S. Randel, W. Freude, C. Koos, "32QAM WDM Transmission Using a Quantum-Dash Passively Mode-Locked Laser with Resonant Feedback" OFC 2017 @ OSA 2017 Th5C.3.
30. K. Merghem, V. Panapakkam, Q. Gaimard, F. Lelarge, A. Ramdane, "Narrow Linewidth Frequency Comb Source based on Self-injected Quantum-Dash Passively Mode-Locked Laser" OFC 2017 @ OSA 2017 SW1C.5.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A method for narrowing a linewidth of a coherent comb laser (CCL) comprising:
providing a mode-locked semiconductor coherent comb laser (CCL) with a laser cavity defined by an active gain material in a waveguide between two facets, the CCL adapted to output of at least 4 mode-locked lines, each with an original linewidth of less than 100 MHz;
tapping a fraction of a power from the CCL from the laser cavity to form a tapped beam;

propagating the tapped beam to an attenuator to produce an attenuated beam and propagating the attenuated beam back to the laser cavity, on a solid waveguide; and reinserting the attenuated beam into the laser cavity, where the reinserted beam has a power less than 10% of a power of the tapped beam, where the reinsertion allows the CCL to be operated to output the mode-locked lines, each with a linewidth of less than 80% of the original linewidth, and an optical path between tapping and reinsertion is polarization maintaining.

2. The method of claim 1 where the provided mode-locked semiconductor CCL:
   is electrically pumped; controlled by a low noise laser driver, and temperature controlled;
   is a ridge waveguide laser with edge facets forming a Fabry-Perot cavity;
   is one of: a small edge-emitting laser, an external cavity laser, a monolithic (internal-cavity) laser, a diode bar laser, a stacked diode bar laser, a surface-emitting laser (VCSEL), such as an optically pumped surface-emitting external-cavity semiconductor laser (VECSEL), or a quantum cascade laser; or
   has an active gain material comprising quantum wells, dots, dashes or rods formed of GaAs, AlGaAs, InGaAs, InAs, GaInNAs, GaN, GaP, InGaP, InP, GaInP, or a combination thereof.

3. The method of claim 1 where an optical path length (OPL) of the combined tapping, propagation and reinserting steps is between 5 and 50 m, and the attenuation level is between 15 and 60 dB.

4. The method of claim 1, where tapping the CCL comprises:
   collecting output of a backside facet of the CCL, or providing a coupler to tap a fraction of an output of the CCL.

5. The method of claim 4 where reinserting the attenuated beam comprises reinjecting the attenuated beam into the laser cavity via the backside facet, or the coupler.

6. The method of claim 1 where propagating the tapped beam to an attenuator comprises:
   one of:
   coupling the tapped beam from a bidirectional waveguide path to a unidirectional waveguide circuit including the attenuator; and
   coupling the tapped beam from a bidirectional waveguide path, which includes the attenuator, to a unidirectional waveguide circuit; and further comprises one of:
   providing the attenuator on a bidirectional waveguide path that includes a reflector; and
   providing a partial reflector on the bidirectional waveguide path that serves to both attenuate and reflect the tapped beam.

7. The method of claim 1 wherein the attenuator is a variable optical attenuator.

8. The method of claim 1 where the attenuator has an attenuation range of at least 10 dB; avoids creating spurious reflections; attenuates each of the lines to at least 10 dB; and does not vary an optical path length (OPL) of the combined tapping, propagation and reinserting steps while changing degree of attenuation.

9. The method of claim 7 where the attenuator controls light transmission by an aperture variation, with partial occlusion of the beam.

10. The method of claim 1, where a solid waveguide is provided by PM single mode optical fibres, a microphotonic chip, a photonic crystal arrangement, or an integrated optical system.

11. The method of claim 1 where one of the mode-locked lines output has a stability such that over a one hour period, the linewidth does not vary by more than 100 kHz.

12. A narrow linewidth multi-wavelength laser (MWL) comprising:
   a mode-locked semiconductor coherent comb laser (CCL) with a primary laser cavity defined by an active gain material in a waveguide between two facets, the CCL adapted to output of at least 4 mode-locked lines, each with an original linewidth of less than 100 MHz; and
   a secondary laser cavity coupled to the primary laser cavity for tapping a beam of the CCL and propagating the tapped beam to an attenuator and reinserting the attenuated beam into the primary laser cavity at a power less than 10% of a power of the tapped beam, the secondary laser cavity consisting of polarization maintaining solid waveguides between polarization maintaining components,
wherein a linewidth of each of the at least 4 lines is reduced in proportion to a difference in optical path length between the secondary laser cavity and the primary laser cavity.

13. The MWL of claim 12 wherein the CCL:
   is electrically pumped; controlled by a low noise laser driver, and temperature controlled;
   is a ridge waveguide laser with edge facets forming a Fabry-Perot cavity;
   is one of: a small edge-emitting laser, an external cavity laser, a monolithic (internal-cavity) laser, a diode bar laser, a stacked diode bar laser, a surface-emitting laser (VCSEL), such as an optically pumped surface-emitting external-cavity semiconductor laser (VECSEL), or a quantum cascade laser; or
   has an active gain material comprising quantum wells, dots, dashes or rods formed of GaAs, AlGaAs, InGaAs, InAs, GaInNAs, GaN, GaP, InGaP, InP, GaInP, or a combination thereof.

14. The MWL of claim 12 where an optical path length of the secondary laser cavity is between 5 and 50 m, and the attenuation level is between 15 and 60 dB.

15. The MWL of claim 12 where the secondary laser cavity comprises an optical coupling from one of a backside facet of the CCL, and/or a tap of an output of the CCL via which the beam is tapped and/or reinserted.

16. The MWL of claim 12 where the secondary laser cavity comprises:
   a bidirectional waveguide path coupled to a unidirectional waveguide circuit including the attenuator;
   the bidirectional waveguide path including at least one of:
   a reflector; and a partial reflector on the bidirectional waveguide path that serves to both attenuate and reflect the tapped beam.

17. The MWL of claim 12 where the attenuator is a variable optical attenuator with an attenuation range of at least 10 dB, provisioned to avoid creating spurious reflections, to attenuate each of the lines to at least 10 dB, and to not vary an OPL of the secondary laser cavity while changing the degree of attenuation.

18. The MWL of claim 12 where the attenuator controls light transmission by an aperture variation, with partial occlusion of the beam.

19. The MWL of claim 12 where the secondary laser cavity comprises an optical path between tapping and reinsertion provided by: single mode optical fibres; a free-space optical system; a microphotonic chip; a photonic crystal arrangement; or an integrated optical system.

20. The MWL of claim 12 where one of the at least 4 lines has a stability such that over a one hour period, the linewidth does not vary by more than 100 kHz.

\* \* \* \* \*